United States Patent [19]

Coe

[11] 4,345,968

[45] Aug. 24, 1982

[54] END POINT DETECTION USING GAS FLOW

[75] Inventor: Mary Ellen B. Coe, Colorado Springs, Colo.

[73] Assignee: NCR Corporation, Dayton, Ohio

[21] Appl. No.: 296,754

[22] Filed: Aug. 27, 1981

[51] Int. Cl.³ .................... H01L 21/306; B44C 1/22; C03C 15/00; C03C 25/06

[52] U.S. Cl. .................. 156/627; 156/345; 156/643; 156/646; 204/192 E; 204/298

[58] Field of Search ................. 204/164, 192 E, 298; 156/626, 627, 643, 646, 657, 659.1, 662, 664, 668, 345; 250/531; 324/71 E, 181, 306, 403

[56] References Cited

U.S. PATENT DOCUMENTS 4,160,690 7/1979 Shibagaki et al. ............... 156/643
4,283,249 8/1981 Ephrath ........................... 156/643

OTHER PUBLICATIONS

Marcoux et al., "Methods of End Point Detection for Plasma Etching," Solid State Technology, pp. 115–122, Apr. 1981.
Hitchman et al., "A Simple Method of End-Point Determination for Plasma Etching," J. Vac. Sci. Technol., vol. 17, No. 6, pp. 1378–1381, Nov./Dec. 1980.
Fok, "Plasma Etching of Aluminium Films Using $CCl_4$," ECS Extended Abstracts, vol. 80-1, Spring Mtg., St. Louis, pp. 301–303, May 11–16, 1980.
Ukai et al., "End-Point Determination of Aluminum Reactive Ion Etching by Discharge Impedance Monitoring," J. Vac. Sci. Technol., vol. 16, No. 2, pp. 385–387, Mar./Apr. 1979.
Thomas et al., "Use of Chemically-Reactive Gas Plasmas in Preparing Specimens for Scanning Electron Microscopy and Electron Probe Microanalysis," Scanning Electron Microscopy/1974 (Part 1), Proceedings of the Seventh Annual Scanning Electron Microscope Symposium, IIT Research Institute, Chicago, Apr. 1974, pp. 84–92 and 323–326.
Gorin, "Monitoring of Plasma Chemical Reaction for Ashing and Etching," (Unpublished) Invention Disclosure of the Tegal Corp., Mar. 20, 1974.

*Primary Examiner*—William A. Powell
*Attorney, Agent, or Firm*—J. T. Cavender; Philip A. Dalton, Jr.; Casimer K. Salys

[57] ABSTRACT

Apparatus and methods for end point detection during the plasma etching of integrated circuit wafers. Etching is conducted in a chamber subjected to the vacuum of a pump drawing at a constant volumetric gas flow rate. The etchant gases entering the chamber are regulated by a controller responsive to a feedback loop sensing pressures within the chamber. Changes in the chamber's chemical composition, which occur in time proximity to the end point of etching, affect the pressure and are detected as variations in the gas flow rates. Empirical results confirm the distinctiveness and repeatability which characterize the flow variations at the end point of etching.

12 Claims, 7 Drawing Figures

END POINT DETECTION USING GAS FLOW

BRIEF SUMMARY

The invention, as illustrated and described hereinafter, relates to apparatus and methods for determining the end point of a plasma etch sequence during the fabrication of integrated circuit (IC) wafers. Theoretical analyses involving pneumatic and chemical relationships, together with characterizations of the closed loop operation, are combined with empirical data to develop the system interrelationships and isolate the measurable parameters. In an exemplary manner of exercising the invention, the molar content of the plasma etching chamber is maintained substantially constant by sensing chamber pressure and regulating input gas flow. According to that arrangement, the end point is detected by a distinct variation in the dynamics of the etchant gas flow rate.

With greater particularity, one form of the invention includes inner and outer feedback control loops together regulating the proportioned flow rates of multiple etchant gases in response to the chamber pressure. The flow rates of the gases are regulated to maintain a fixed ratio therebetween, while the combined flow is responsive to chamber pressure. The chemical composition of the gases within the chamber is indicative of the etching progress and is evidenced parametrically by changes in the molar content of the chamber. A vacuum pump, operated to remove chamber gases at a constant rate of volumetric flow, couples the parameters representing chamber pressure to those representing the molar content within the chamber when the input gas flow is regulated to maintain a constant pressure. In effect, end point related changes in the chemical composition of the chamber gas appear as variations in the flow rate of the gases entering the chamber.

One embodiment includes apparatus and methods by which the pressure controller regulating the input gases prescribes a specified ratio between the flow rates of the two gases. Furthermore, in addition to regulating the flow rate of the composite gas into the chamber, each individual gas includes an inner feedback loop coupling the respective gas servo valve with a corresponding flow meter. Again, variations in the conditions within the chamber are perceived as pressure changes and eventually converted to proportional adjustments in the flow rates of the two gases.

Gas flow plots of typical etching sequences are illustrated and described to provide one with a comprehensive understanding of the flow characteristics corresponding to the end point of etching. Included within the group of examples are etches involving photoresist, polycrystalline silicon, tungsten silicide and a sandwich of tungsten silicide/polycrystalline silicon.

DETAILED DESCRIPTION

Figure 1:
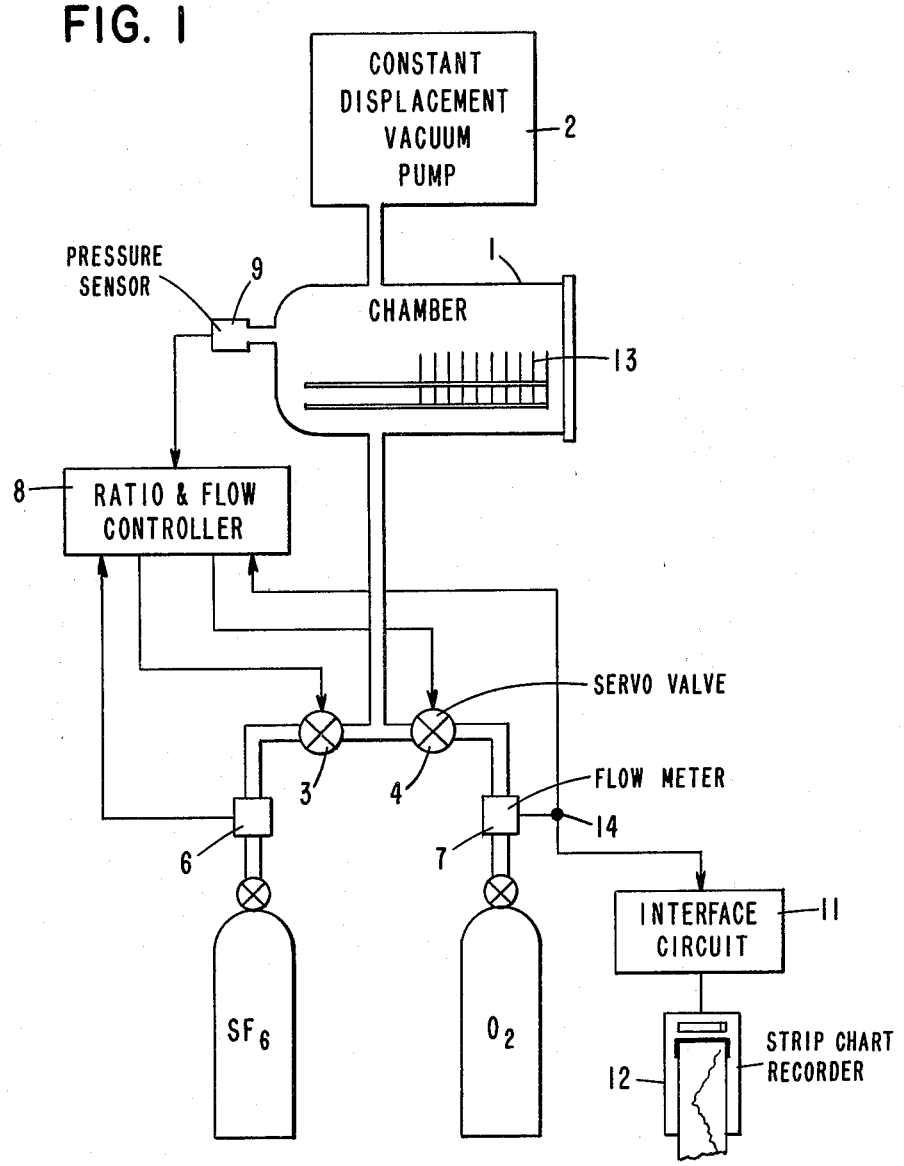
FIG. 1 contains a schematic of the composite system.

Plasma etching processes have gained great importance in recent years as substitutes for wet chemical etching processes in the fabrication of integrated circuits (ICs). The present invention deals with one aspect of the processes involving this technology, namely, the precise and reproducible determination of when plasma etching should be terminated, commonly known as end point detection.

Recognizing the extensive availablity of literature dealing with plasma etching techniques and equipment, one skilled in the art is undoubtedly already aware of the importance attributed to end point detection. An illustrative recent article, summarizing the recognized technology of end point detection, is printed in the April 1981 issue of Solid State Technology, entitled "Methods of End Point Detection for Plasma Etching" and authored by P. J. Marcoux et al.

At present, the emission spectroscopy method of end point detection has the greatest following of users. Recent plasma etching process developments have, unfortunately, refined and altered recognized procedures to the point where conventional optical methods are no longer capable of providing the precision sought under controlled laboratory conditions, and are clearly inadequate for a volume manufacturing environment. In part, this is attributable to the increased concentration of oxygen in the etchant gas, displacing more of the fluorine-based gas upon which the optical methods strongly rely. A review of the literature and hardware associated with implementing most optical methods also suggests a dire need for greater simplicity and a lower cost.

To these ends, the present invention describes and illustrates a novel method of end point detection. The method is distinguishable not only by its departure from the generally recognized norm, but also its refinement of that departure to regulate and detect the progress of etching by monitoring the effects of a closed loop operation. Namely, the method relies upon measurements of actual gas flow, in the setting of a feedback loop control which maintains a constant chamber pressure by varying the flow rates of the various gases. The gas flow rates are related, in the manner described, to the chemical reactions occurring within the chamber.

Other aspects of the invention will become more apparent hereinafter, when the theoretical analysis and various embodiments are described in the context of hardware and test data. The invention will first be presented from a theoretical perspective, then shown in terms of hardware configurations, and finally in the context of test results for an exemplary group of embodiments.

In terms of supporting theoretical development, one may begin with the classic ideal gas law, $$PV = nRT, \qquad (1)$$

and proceed to recognize that the plasma etching chamber and ancillary control systems constrain the volume, V, and the gas constant, R, to substantially constant values. Though the temperature increases slightly during the etching process, the effects are sufficiently minor to also consider the temperature, T, as a constant in the mathematical relationship.

Another relationship can be established between pressure, P, within the etching chamber, the volumetric flow, Q, into the chamber and the speed, S, of a vacuum pump attached to the chamber, wherein, $$Q = PS. \quad (2)$$

Absent external influences, the relationship in equation (2) merely defines that if pumping speed is increased, the pressure will decrease, or if flow is increased, the pressure will increase proportionally. For purposes of the present invention, the pump speed remains essentially constant during the period of concern.

Now, substituting the relationship defined by equation (2) into equation (1) and inserting subscripted letters C for variables heretofore constrained to be constants, one arrives at the following relationship:

$$Q(C_V/C_S) = n \, C_R \, C_T. \quad (3)$$

This relationship shows that the volumetric flow, Q, and the number of moles of atoms, n, are directly proportional during the course of a plasma etch sequence.

The number of moles within the chamber system changes during the progression of the etching process by virtue of chemical reactions. For example, if the etchant gas $SF_6$ is introduced into the system, the radio frequency (RF) energy in the plasma produces a chemical reaction defined by the following transformation relationship:

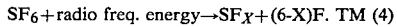

$$SF_6 + \text{radio freq. energy} \rightarrow SF_X + (6-X)F. \text{ TM} \quad (4)$$

From relationship (4), it is apparent that the number of moles n increases as an outcome of the chemical reaction induced by RF energy. Recall, however, that the invention contemplates a system in which chamber pressure is regulated to remain substantially constant by closed loop adjustments in the flow rates of the input gases. Since the vacuum pump withdraws gas from the etching chamber at a constant volumetric flow rate, and the gases entering the chamber change their composition according to equation (4), relationships (1) and (3) prescribe that the flow rate of the input gases must be decreased to maintain constant pressure.

Note that the above analysis provides for only one reaction within the chamber, namely, the RF energy with $SF_6$ gas. In the operation of an actual etching chamber, other chemical reactions are occurring simultaneously. A representative example is the etching of a olycrystalline silicon surface using the F ions generated during transformation (4). That chemical reaction is defined by transformation relationships (5) or (6).

$$Si + 4F \rightarrow SiF_4, \quad (5)$$

or

$$Si + 2F_2 \rightarrow SiF_4 \text{ (more likely)}. \quad (6)$$

One no doubt recognizes that either transformation (5) or (6) produces a decrease in the number of moles within the chamber. To compensate for such a change in the chamber conditions, again recognizing the fixed pressure requirement, the flow rate of input gases must increase. In the case of etching polycrystalline silicon, chemical reactions (5) or (6) account for the increase in flow rate accompanying the onset of plasma etching in the context of the contemplated system.

In one manner of practicing the invention, the completion of etching is evidenced by an abrupt and significant change in the gas flow rate from its etching equilibrium to a succeeding equilibrium level. The conceptual foundation is again linked to the molar constancy of the vacuum pump and the fixed level of chamber pressure. For example, upon the exhaustion of the polycrystalline silicon being etched, the RF generated fluorine radicals in the chamber cease undergoing the chemical reactions defined in transformations (5) or (6). The consequential rise in molar density produces a corresponding rise in the chamber pressure, which in turn decreases the input gas flow rate in response to signals conveyed by the feedback loop of the flow control. Note that this change in flow rate is substantially coincident with the completion of the polycrystalline silicon etch sequence.

Though the chemical reactions differ, the fundamental principles described above apply in like manner to other etchant gases and etched materials. For instance, in the case of etching photoresist materials, tests have shown analogous end point characteristics when etching three different positive material types and one negative material type. The etching or stripping of photoresist layers using a plasma does differ in one respect, in that the gas flow increases upon reaching the end point of etching. This occurs because the resist, at the onset of etching, reacts quite readily and forms a large number of moles within the chamber. As more of the resist is etched away, fewer moles are formed, chamber pressure decreases, and gas flow increases to maintain the regulated level of pressure.

Given the foregoing theoretical foundation, it still remains necessary to define practical organization of methods and structural apparatus suitable for detecting the end point. As specifically embodied herein, the end point is detected as a change in the electrical signal generated by a gas flow meter situated in one path leading to the etching chamber. Refer to FIG. 1 for a schematic illustration of the composite system. As shown, chamber 1 is a barrel type plasma etcher. The chamber is evacuated using a pump, 2, which draws at a constant rate of volumetric flow, while etchant gases entering the chamber are supplied through servo valves 3 and 4, providing $SF_6$ and $O_2$, respectively. Flow meters 6 and 7 are coupled to ratio and flow controller 8. At the left end of chamber 1 is a capacitance manometer type pressure sensor, 9, which is directly coupled to controller 8. In the present manner of practicing the invention, oxygen flow is measured electrically using flow meter 7, whereafter the signal is processed by interface circuit 11 and visually depicted by strip chart reporter 12. Within the chamber shown, there appear a group of silicon wafers 13.

The practice of the invention according to FIG. 1 includes an arrangement of commercially available apparatus. The etching chamber is an IPC Model 2000, the controller is an MKS Model 254, both servo valves are Brooks/MKS Model 251-200, both flow meters are Tylan/MKS Model FM 360, while the capacitance manometer is a Baratron/MKS Model 222A. The vacuum pump, 2, is a conventional unit. The interface circuit, 11, will be shown and described at a later point in the development. The remaining item in the system, the strip chart recorder, is also a conventional laboratory instrument with high input impedance and an input signal range extending from 0 to approximately 1 volt.

Figure 2:
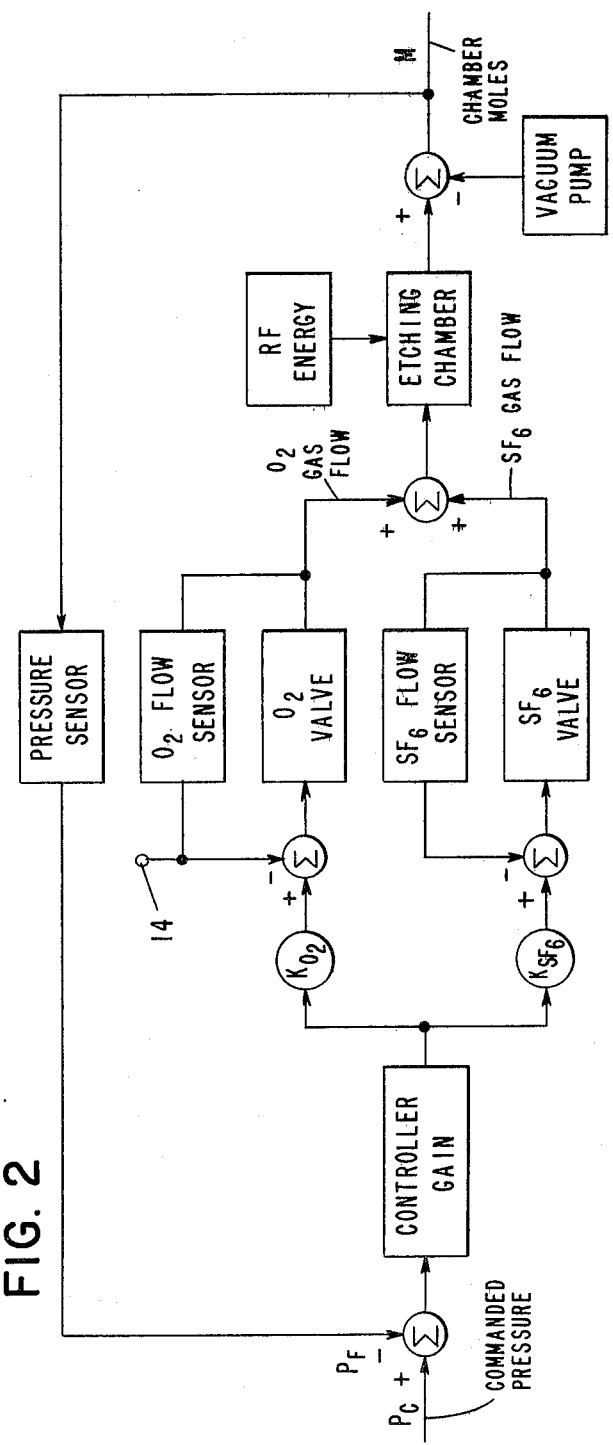
FIG. 2 presents a block diagram schematically showing the feedback loops characterizing the embodiment.

Before embarking upon an analysis of exemplary etch sequences, it would be desirable to recognize the nuances of the composite system. For purposes of such considerations, note FIG. 2 of the drawings showing the mechanical, electrical, chemical and pneumatic couplings of the apparatus in FIG. 1. The presentation in FIG. 2 is in the format of a simplified feedback control system. The blocks represent transfer functions, while the lines of flow depict the manner of coupling. Together, they conceptually illustrate the complete system and accentuate the distinguishing features. No attempt will be made to mathematically describe the transfer functions represented in each block, since it is the organization that has the focus of attention. However, when a block serves a unique purpose, or contributes an important effect, it will be highlighted.

Begin at the left with signal $P_C$. Signal $P_C$ is defined as being the commanded pressure. The error between the commanded and the sensed feedback pressure, $P_F$, is amplified by the controller gain and provided to a pair of parallel inner loops individually regulating the flow rates of oxygen and $SF_6$ gas. Since the command to each of the inner loops is identical, except for multiplication factors $K_{O2}$ and $K_{SF_6}$, the steady state ratio of gas flow is identical to the ratio of these constant factors. A comparison of FIGS. 1 and 2 shows the correspondence of node 14, the point for monitoring gas flow.

The embodiment in FIG. 1 shows that the gas from each inner loop is pneumatically combined before entering the etching chamber. The simplified feedback control system presented in FIG. 2 omits the cross-coupling effects between the two gas loops, simplifying the presentation and recognizing that their effects are secondary.

Generally, end point detection is an attempt to correlate the conditions on a wafer to the chemical composition of the gases within the etching chamber. However, the numerous nonlinear effects attributable to the plasma etching chamber, to variables such as the gas flow rates, the RF energy levels, the diversity of gases undergoing chemical decomposition, and to the rates and types of chemical reactions taking place between chamber gases and exposed wafer materials, severely complicate the detection process. Interestingly, the present invention makes no attempt to separate the nonlinear effects as they appear within the chamber, but rather, monitors the effects on a functionally cascaded element within a closed loop.

As shown, the negative contribution of the vacuum pump to the molar content of the chamber, where the content is represented by the symbol M, is substantially constant in magnitude. Consequently, the aforementioned relationship between pressure and molar content insures that the outer feedback loop, sensing and regulating chamber pressure, coincidentally regulates the molar content of the gas within the chamber. When the controller gain is adequate, the molar content of the chamber is maintained by the balance between the commanded pressure, $P_C$, and the feedback pressure, $P_F$. Though the foregoing relationships presuppose a static mode of operation, the dynamics of the system parameters, after the start-up transients have subsided, are sufficiently low, stable and damped, that the static relationships are not materially altered.

When viewing the composite system in the context of a feedback control, one now recognizes that the nonlinear effects in the direct path, i.e., those created within the etching chamber, are substantially offset by equal and opposite changes in the gas flows. If feedback control of the chamber pressure in the manner shown maintains a constant molar content therein, all chemical changes within the etching chamber which affect the molar content, whether those changes are linear or nonlinear, appear as variations in the gas flow rate. Contrast this with an open loop configuration, in which the changes internal to the chamber appear as dispersed effects in th optical, flow or pressure characteristics.

Node 14 was selected as a monitoring point from the perspective of convenience, since the change in oxygen flow rate is greater both in absolute value of gas and in electrical signal. Once the effects of the closed loops are recognized, other suitable detection points for sensing changes in gas flow can be located and suitably sensed. For instance, a gas other than oxygen or a combination of the various gases.

Figure 3:
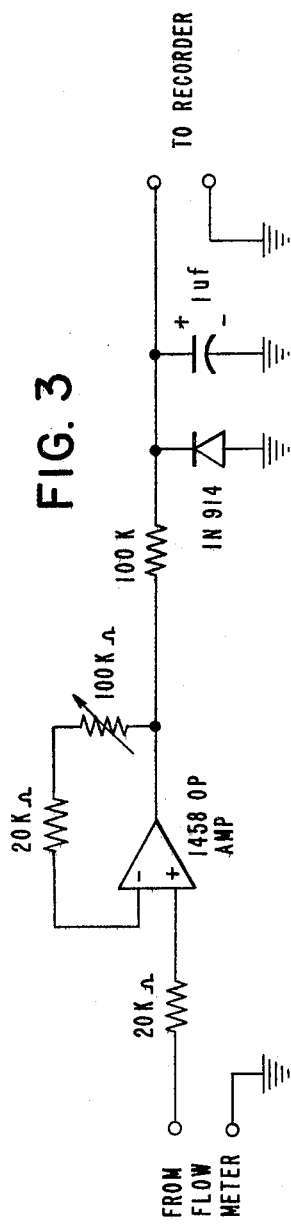
FIG. 3 is a schematic diagram of the interface circuit used with the system in FIG. 1.

The interface circuit presented in FIG. 3, corresponding to block 11 in FIG. 1, is comparatively rudimentary, introducing a nominal electrical gain and limited noise filtering. As to the latter effect, the 0.1 second time constant proved to be adequate for the specific embodiment. The frequencies filtered suppressed extraneous noise without distorting the dynamic characteristics of the gas flow rates. One no doubt recognizes that the filter time constant is readily variable and should be consistent with the response characteristics of the remaining hardware.

Test results have confirmed that the end point detection systems and processes described herein are not only viable in the context shown, but are suitable for use with a broad range of IC materials capable of undergoing plasma etching. For instance, successful results have been shown with polycrystalline silicon, a variety of different photoresists, tungsten silicide, a tungsten silicide/polycrystalline silicon sandwich, and polycrystalline silicon etched with a low concentration of oxygen. In each case, the end point was reliably and repeatedly detected.

Figure 4A:
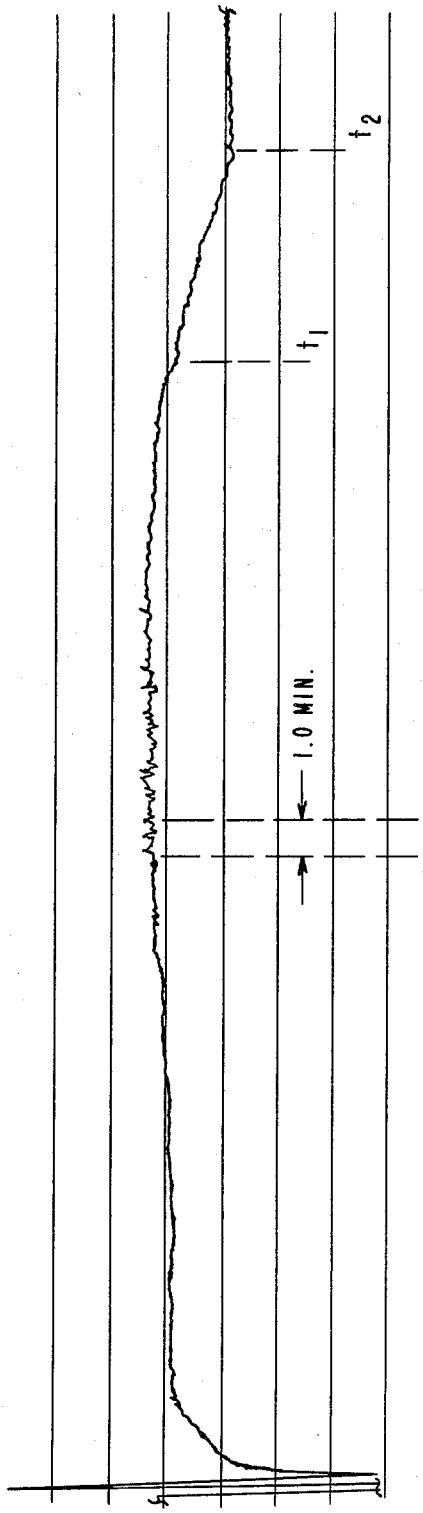
FIGS. 4A and 4B are strip chart presentations of gas flow rates for etch sequences involving polycrystalline silicon layers.
Figure 4B:
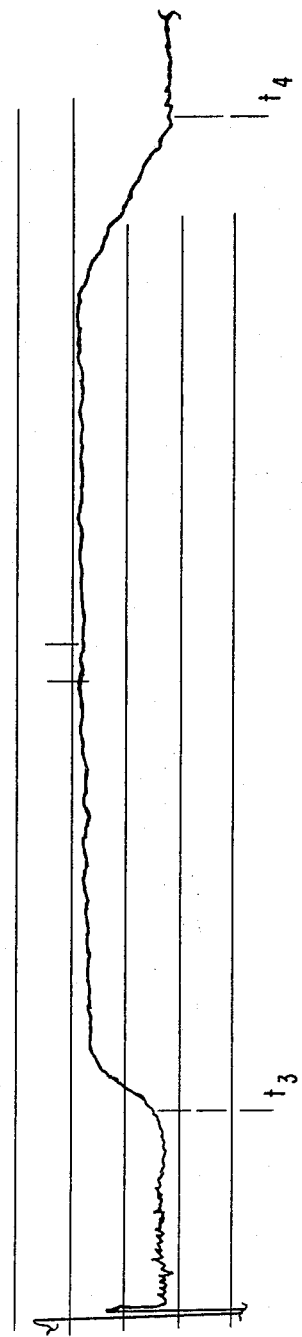
Figure 5A:
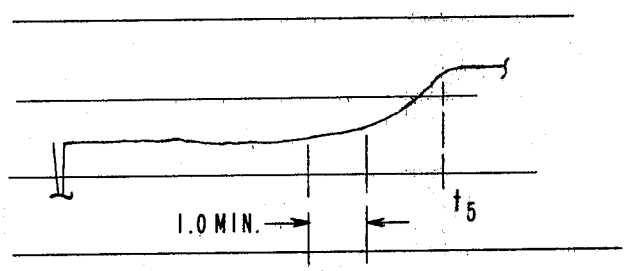
FIGS. 5A and 5B are strip chart presentations of gas flow rates for etch sequences involving a photoresist layer and a sandwich layer of tungsten silicide/polycrystalline silicon, respectively.
Figure 5B:
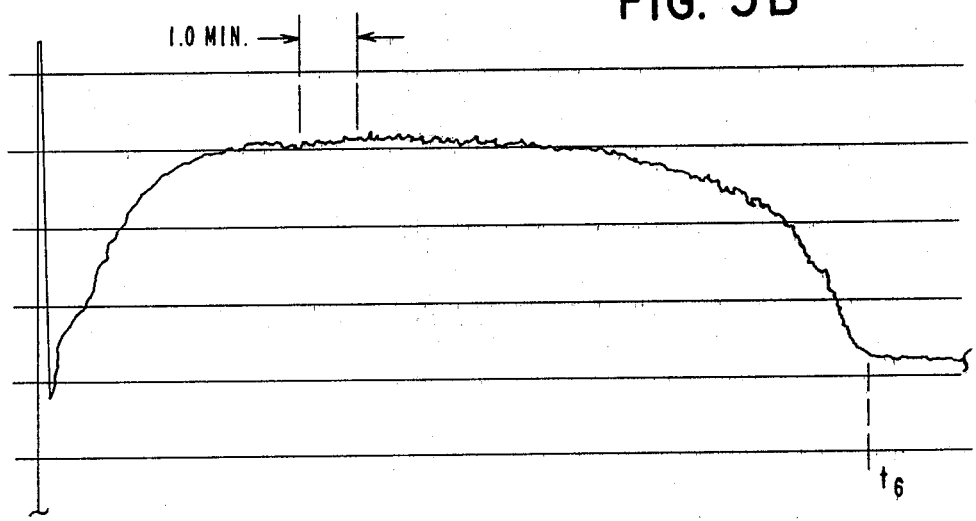

To expand one's understanding of the system and processes, the drawings have been supplemented with four plots illustrating the shapes of representative outputs generated on a strip chart recorder. Since the amplitudes of the waveforms shown provide no meaningful information, aside from relative changes with respect to the plots themselves, scale markings have been deleted. A one minute increment of time is shown in each pair of plots to provide one with a feel for the relative durations. FIGS. 4A and 4B show two polycrystalline silicon etch sequences, with the former having a chamber load of ten wafers and the latter loaded at five wafers. FIG. 5A corresponds to a photoresist strip etching sequence, with the chamber carrying a six wafer load. The last example, illustrated in FIG. 5B, represents an etch of nine wafers, in which the etched material was a tungsten silicide/polycrystalline silicon sandwich.

FIRST EXAMPLE

FIG. 4A shows a time plot of oxygen flow obtained from recorder 12 when etching polycrystalline silicon using the embodiment shown in FIG. 1. The oscillatory behavior of the gas flow immediately after the onset of the flow and the RF plasma merely illustrates the existence of an initial period of unstable flow rates. Within approximately one minute, the oscillatory operations subside and oxygen gas flow rises smoothly to a substantially steady level. At a later point in time, approximately $t_1$, the polycrystalline silicon layer undergoing etching shows signs of being depleted. In the manner described hereinbefore, the depletion initiates a rise in chamber pressure, or as depicted here, a drop in the flow rate of oxygen gas. Time $t_2$ corresponds to the end point of etching, clearly indicated in the plot by the presence of a stable new level.

In the practical setting of an automated or operator-controlled process, time $t_2$ is readily discernible because conventional etching procedures extend the etching sequence by an additional overetch period of approximately ten percent to compensate for normal layer depth tolerances. Overetching ensures complete removal of the etched layer material, which is typically distributed with a ±10% nonuniformity in thickness. One undoubtedly recognizes that such periods of overetching ease the burden of determining the end point by providing a relatively stable period against which to compare any changes in the flow rate.

SECOND EXAMPLE

As was true of the first example, the polycrystalline silicon etch sequence in FIG. 4B commences with a brief period of instability. In this case, however, the leading edge of the plot differs in that the rise to a stable level is delayed until time $t_3$. The phenomenon illustrated is generally known as "scumming," and represents the etching of a scum layer of photoresist material covering the wafer at the time plasma etching is commenced. Note from the analysis contained hereinbefore, etching of photoresist increases, rather than decreases, the molar content in the chamber. Consequently, the oxygen flow rate is shown to increase at the completion of scumming and the onset of polycrystalline silicon etching.

The end point of etching is again clearly evident from the plot at time $t_4$. As is standard practice, an overetch interval follows.

THIRD EXAMPLE

FIG. 5A illustrates the typical results obtained when etching a layer of photoresist. After the initial oscillatory period, the oxygen gas flow remains low as a result of the increased molar content in the chamber. Again, the end point of etching is evidenced by an abrupt change followed by a stable new level of etchant gas flow. In this case, the end point corresponds to time $t_5$.

FOURTH EXAMPLE

The curvature in the gas flow plot of FIG. 5B illustrates the effects of etching a compound layer including tungsten silicide and polycrystalline silicon. Nevertheless, the end point of the etch sequence remains remarkably distinct at point $t_6$.

Given the development hereinbefore, one undoubtedly recognizes that the fundamental concepts presented are broader than the embodiments by which they have been illustrated. For instance, the reactions within the chamber, their effects on the molar quantities, the relationship to end point, and their interaction with the pressure and gas flow, suggest other system organizations and structural implementations than those appearing in FIGS. 1 and 2. Therefore, it is feasible, through not presently practical, to set the input gas flow rates to fixed values and close the feedback loop by regulating the output side gas flow rate by changing the vacuum pump speed. If a variable speed pump is not available, it is also conceivable that the output gas flow rate could be regulated with a variable orifice so as to maintain the chamber pressure at a fixed level. In the first of the above cases, changes in pump speed would be used to detect the end point, while in the latter case, end point would be derived from changes in the orifice setting.

It should be recognized that in all the foregoing cases end point is characterized by the interaction of chamber pressure and flow rate when one parameter is regulated with a feedback loop while the other responds to changes in the chemical makeup within the chamber.

From the foregoing it is also clear that the invention contemplates and encompasses the plasma etching of numerous types of diversely mixed materials. Furthermore, the invention contemplates variations in the chamber structure, organization and character of the apparatus, the number and compositions of the etchant gases, techniques for regulating gas flow rates, and other known or readily perceived alterations of the systems shown and described herein. It is believed that these variants can be assimilated within the present teaching without departing from the scope and spirit of the invention claimed.

I claim:
1. A plasma etching system comprising:
a plasma etching chamber;
means for sensing the molar content within said chamber;
a source of first etchant gas;
means for coupling said first gas into said chamber;
first means, for regulating the flow rate of said first gas through said means for coupling said first gas;
means for extracting gases from said chamber,
second means, for regulating the flow rate of gases through said means for extracting;
control means, responsive to said means for sensing the molar content, for actuating said first and second means for regulating, so that one means for regulating maintains a substantially constant flow rate while the other means for regulating responds to said means for sensing the molar content; and
means for sensing changes, in the means for regulating which responds to said means for sensing the molar content, to detect the end point of etching.

2. The system recited in claim 1, wherein said control means actuates said other means for regulating to maintain a substantially constant molar content in said chamber.

3. The system recited in claim 2, wherein said means for sensing the molar content comprises a pressure sensor.

4. The system recited in claim 3, wherein said second means for regulating maintains said substantially constant flow rate.

5. The system recited in claim 4, further comprising:
a source of second etchant gas;
means for coupling said second gas into said chamber;
third means, for regulating the flow rate of said second gas through said means for coupling said second gas; and
wherein said control means for actuating also actuates said third means for regulating the flow rate so that changes detected by said pressure sensor are substantially offset by composite changes in the flow rates of said first and second gases.

6. The system recited in claim 5, wherein said control means for actuating regulates the flow rates of said first and second gases to maintain a fixed proportion by volume.

7. The systems recited in claims 4 or 6, wherein said second means for regulating is a constant displacement vacuum pump.

8. The system recited in claim 7, wherein said means for sensing changes comprises a gas flow meter.

9. The system recited in claim 8, wherein said gas flow meter generates a time plot of the flow rate suitable for detecting flow rate changes corresponding to the termination of etching.

10. A method for determining the end point of plasma etching, comprising:
  coupling a plasma etching chamber to a source of vacuum and a source of etchant gas;
  regulating either the inlet gas flow rate or the gas flow rate to said source of vacuum, while holding the other substantially constant, to maintain a fixed molar content within said chamber; and
  sensing the time related change of said regulated gas flow during the progression of etching to detect transitions between substantially steady levels.

11. The method recited in claim 10, wherein said fixed molar content is represented by the pressure within said chamber.

12. An etching system comprising:
  an etching chamber;
  means for sensing the molar content within said chamber;
  a source of first etchant gas;
  means for coupling said first gas into said chamber;
  first means, for regulating the flow rate of said first gas through said means for coupling said first gas;
  means for extracting gases from said chamber,
  second means, for regulating the flow rate of gases through said means for extracting;
  control means, responsive to said means for sensing the molar content, for actuating said first and second means for regulating, so that one means for regulating maintains a substantially constant flow rate while the other means for regulating responds to said means for sensing the molar content; and
  means for sensing changes, in the means for regulating which responds to said means for sensing the molar content, to detect the end point of etching.

* * * * *